(12) United States Patent
Smith et al.

(10) Patent No.: US 6,842,334 B2
(45) Date of Patent: Jan. 11, 2005

(54) PORTABLE DIAGNOSTIC APPARATUS FOR COMPUTER COMPONENTS AND SYSTEMS AND METHOD OF USING SAME

(75) Inventors: John V. Smith, Poway, CA (US); Victor P. Hester, El Cajon, CA (US)

(73) Assignee: Verari Systems, Inc., San Diego, CA (US)

( * ) Notice: Subject to any disclaimer, the term of this patent is extended or adjusted under 35 U.S.C. 154(b) by 0 days.

(21) Appl. No.: 10/655,862

(22) Filed: Sep. 5, 2003

(65) Prior Publication Data

US 2004/0052065 A1 Mar. 18, 2004

Related U.S. Application Data

(60) Provisional application No. 60/411,850, filed on Sep. 18, 2002.

(51) Int. Cl.$^7$ .................................................. G06F 1/16
(52) U.S. Cl. ........................ 361/681; 361/818; 165/804; 211/175
(58) Field of Search ................................ 361/681–687, 361/694–695, 715–716, 724–727, 818; 165/80.4, 185, 104.33; 174/15.2; 211/175

(56) References Cited

U.S. PATENT DOCUMENTS

| | | | | | |
|---|---|---|---|---|---|
| 4,672,509 | A | * | 6/1987 | Speraw ........................ | 361/687 |
| 5,351,176 | A | * | 9/1994 | Smith et al. ................. | 361/681 |
| 5,971,506 | A | * | 10/1999 | Dubin ...................... | 312/223.2 |
| 6,185,098 | B1 | * | 2/2001 | Benavides ................... | 361/695 |
| 6,487,080 | B2 | * | 11/2002 | Robbins et al. .............. | 361/727 |
| 6,556,956 | B1 | * | 4/2003 | Hunt ........................... | 702/188 |
| 2004/0165348 | A1 | * | 8/2004 | Clark et al. ................. | 361/686 |

* cited by examiner

*Primary Examiner*—Hung Van Duong
(74) *Attorney, Agent, or Firm*—Duckor Spradling Metzger & Wynne; Bernard L. Kleinke (57) ABSTRACT

According to at least one of the disclosed embodiments of the present invention, there is provided a diagnostic assembly for use with computers, computer components, computer systems or networks, and includes a pair of side panels, each having mounting means or device for engaging a support member or bracket. In one embodiment, the portable diagnostic assembly further includes a horizontal support plate engaging portions of each of the side panels. A diagnostic module is disposed or mounted on the horizontal support plate and is adapted to communicate with at least one of a computer, computer component, computer system and network to be diagnosed.

10 Claims, 9 Drawing Sheets

PORTABLE DIAGNOSTIC APPARATUS FOR COMPUTER COMPONENTS AND SYSTEMS AND METHOD OF USING SAME

RELATED APPLICATION

This application claims priority to U.S. provisional Patent Application Ser. No. 60/411,850 titled "Portable Diagnostic Apparatus for Computer Components and Systems and Method of Using Same," filed Sep. 18, 2002, which is hereby incorporated by reference in its entirety. Additionally, priority is claimed to U.S. non-provisional patent application Ser. No. 10/449,799, filed May 29, 2003, titled "Rack Mountable Computer Component and Method of Making Same"; Ser. No. 10/448,691, filed May 29, 2003, titled "Rack Mountable Computer Component Cooling Method and Device"; Ser. No. 10/449,608, filed May 29, 2003, titled "Rack Mountable Computer Component For Cooling Arrangement and Method; and Ser. No. 10/448,508, filed May 29, 2003, titled "Rack Mountable Computer Component Power Distribution Unit and Method".

This application is related to U.S. patent application Ser. No. 10/160,526, titled "Method and Apparatus for Rack Mounting Computer Components," filed May 31, 2002, U.S. Provisional Application Ser. No. 60/384,996, titled "Rack Mountable Computer Component and Method of Making Same," filed May 31, 2002; U.S. Provisional Application Ser. No. 60/384,987, titled "Rack Mountable Computer Component Cooling Method and Device," filed May 31, 2002; U.S. Provisional Application Ser. No. 60/384,986, titled "Rack Mountable Computer Component Fan Cooling Arrangement and Method," and U.S. Provisional Application Ser. No. 60/385,005, titled "Rack Mountable Computer Component Power Distribution Unit and Method," filed May 31, 2002, which are each hereby incorporated by reference in their entirety.

BACKGROUND OF THE INVENTION

1. Field of the Invention

The present invention relates in general to computer components. It more particularly relates to components and methods of using in connection with rack mounted computer equipment.

2. Related Art

There have been a variety of different types and kinds of methods and systems for mounting computer components. For example, reference may be made to the following United States patents:

| PATENT NO. | INVENTOR | ISSUE DATE |
|---|---|---|
| 4,258,967 | Boudreau | Mar. 31, 1081 |
| 4,879,634 | Storrow et al. | Nov. 7, 1989 |
| 4,977,532 | Borkowicz et al. | Dec. 11, 1990 |
| 5,010,444 | Storrow et al. | Apr. 23, 1991 |
| 5,216,579 | Basara et al. | Jun. 1, 1993 |
| 5,460,441 | Hastings et al. | Oct. 24, 1995 |
| 5,571,256 | Good et al. | Nov. 5, 1996 |
| 5,684,671 | Hobbs et al. | Nov. 4, 1997 |
| 5,877,938 | Hobbs et al. | Mar. 2, 1999 |
| 5,896,273 | Varghese et al. | Apr. 30, 1999 |
| 6,025,989 | Ayd et al. | Feb. 15, 2000 |
| 6,058,025 | Ecker et al. | May 2, 2000 |
| 6,075,698 | Hogan et al. | Jun. 13, 2000 |
| 6,220,456 B1 | Jensen et al. | Apr. 24, 2001 |
| 6,305,556 B1 | Mayer | Oct. 23, 2001 |

-continued

| PATENT NO. | INVENTOR | ISSUE DATE |
|---|---|---|
| 6,315,249 B1 | Jensen et al. | Nov. 13, 2001 |
| 6,325,636 B1 | Hipp et al. | Dec. 4, 2001 |
| Re. 35,915 | Hastings et al. | Oct. 6, 1998 |
| Des. 407,358 | Belanger et al. | Mar. 30, 1999 |

Computer systems such as networks, rack mounted computer clusters, or mainframes may generally be provided with a link which allows a user or a system administrator to monitor and/or maintain the various components. For example, a workstation may be provided at or near the physical location of each server, computer and/or mainframe. A building having several networks or computer systems may require a separate diagnostic workstation for each such network or system. This can greatly increase the cost of each network or system for some applications. Further, much of that cost may be wasted or at least add a disproportionately small value in proportion to the amount of the expenditure, since the diagnostic workstation for each individual network or system is rarely used on a regular basis for many applications. Rather, it may generally be used only for routine maintenance and monitoring of the network or system.

BRIEF DESCRIPTION OF THE DRAWINGS

The following is a brief description of the drawings.

DESCRIPTION OF CERTAIN EMBODIMENTS OF THE INVENTION

According to at least one of the disclosed embodiments of the present invention, there is provided a diagnostic assembly for use with computers, computer components, computer systems or networks, and includes a pair of side panels, each having mounting means or device for engaging a support member or bracket. In one embodiment, the portable diagnostic assembly further includes a horizontal support plate engaging portions of each of the side panels. A diagnostic module is disposed or mounted on the horizontal support plate and is adapted to communicate with at least one of a computer, computer component, computer system and network to be diagnosed.

In the disclosed embodiments, the mounting means or device has a pin, and the support bracket includes a tube or socket adapted to receive the pin. It will become apparent to those skilled in the art that the pin can be installed on either the bracket or the diagnostic assembly, and the tube or socket can be installed on the bracket or assembly as well.

Referring now to FIGS. 1–4, there is illustrated one embodiment of a rack mounted system 10, which may be used with the diagnostic assembly of an embodiment of the invention as hereinafter described in greater detail. The rack mounted system 10 includes a rack housing 12 configured generally as a rectangular box having a plurality of vertical bays 14. The embodiment illustrated in the drawings includes three vertically spaced-apart bays 14.

Each bay 14 is divided into a front bay portion 16 and a rear bay portion 18 by an intermediate transversely-extending horizontal divider 19. The bays 14 are formed in the rack housing 12 in a vertical manner one above the other. In a bottom portion of the rack housing 12, a control bay 21 is provided to house various controlled components, as hereinafter described in greater detail.

The rack housing 12 further includes a fan/LAN tray slot 23 above each bay 14. Each fan/LAN tray slot is configured to accommodate a fan/LAN tray such as tray 27.

Figure 1:
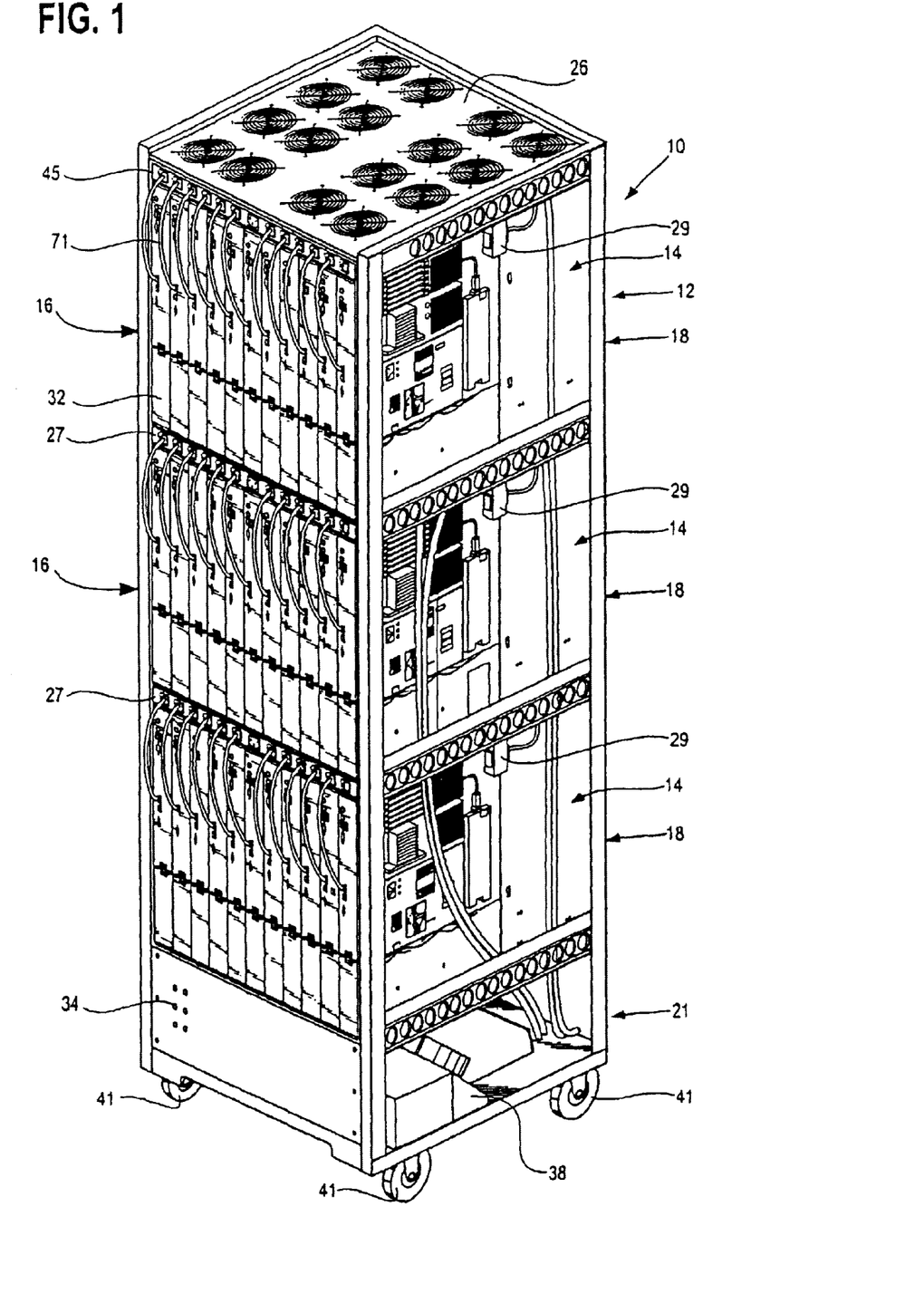
FIG. 1 is a pictorial view of a rack-mounted computer system showing the front, left side and top thereof, which may use an embodiment of the present invention.

The system illustrated in the drawings provides a control bay 21 having a bottom opening 25 for facilitating air flow to receive vertically moving air flow from a vent opening 26 in a floor 28 and vertically through the system 10 as assisted by the fan/LAN trays. At the top of the rack housing 12, an apertured top panel 26 is provided to permit venting of the vertically moving air flow from the system 10.

At the top portion of each bay 14, in the intermediate region between the front bay portion 16 and the rear bay portion 18, a power distribution unit (PDU) 29 is provided to supply electricity to various components mounted in the rack mounted system. Each bay is adapted to accommodate a plurality of computer components in the form of open structure computer blades, such as blade 32, in each of the front bay portions 16 and the rear bay portions 18. In the embodiment illustrated in the figures, eleven blades may be accommodated in each of the front bay and rear bay portions. Thus, in the illustrated embodiment, the system 10 accommodates 66 computer components in a densely compact, closely spaced configuration.

Figure 2:
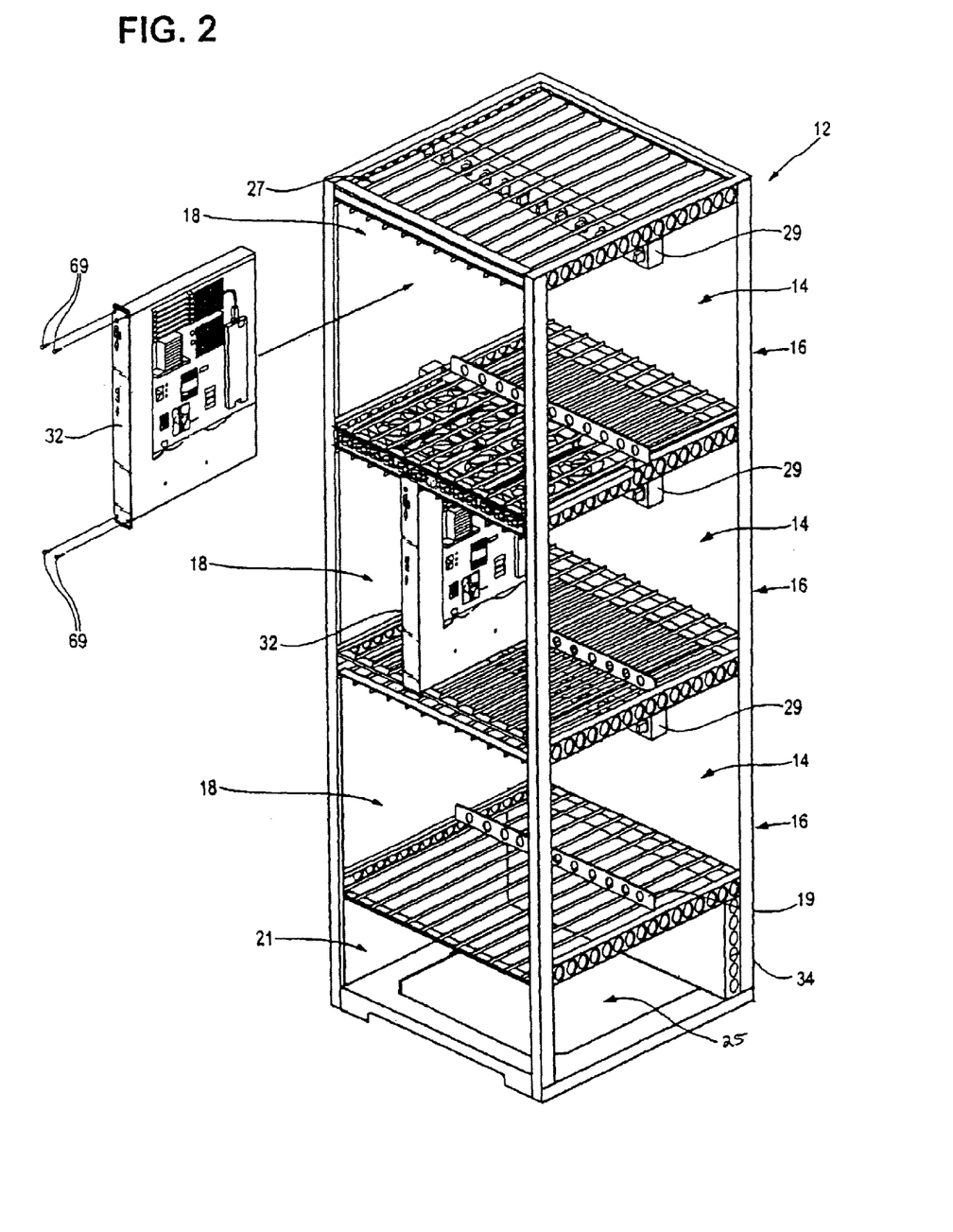
FIG. 2 is a pictorial view of a housing of the system of FIG. 1, illustrating the process of installation of computer blades.
Figure 3:
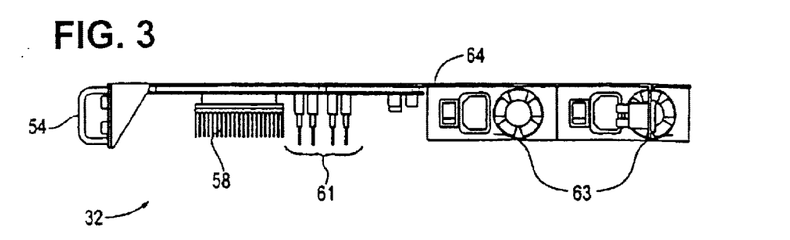
FIG. 3 is an enlarged scale top view of one embodiment of a blade of the rack-mounted system of FIG. 1.
Figure 4:
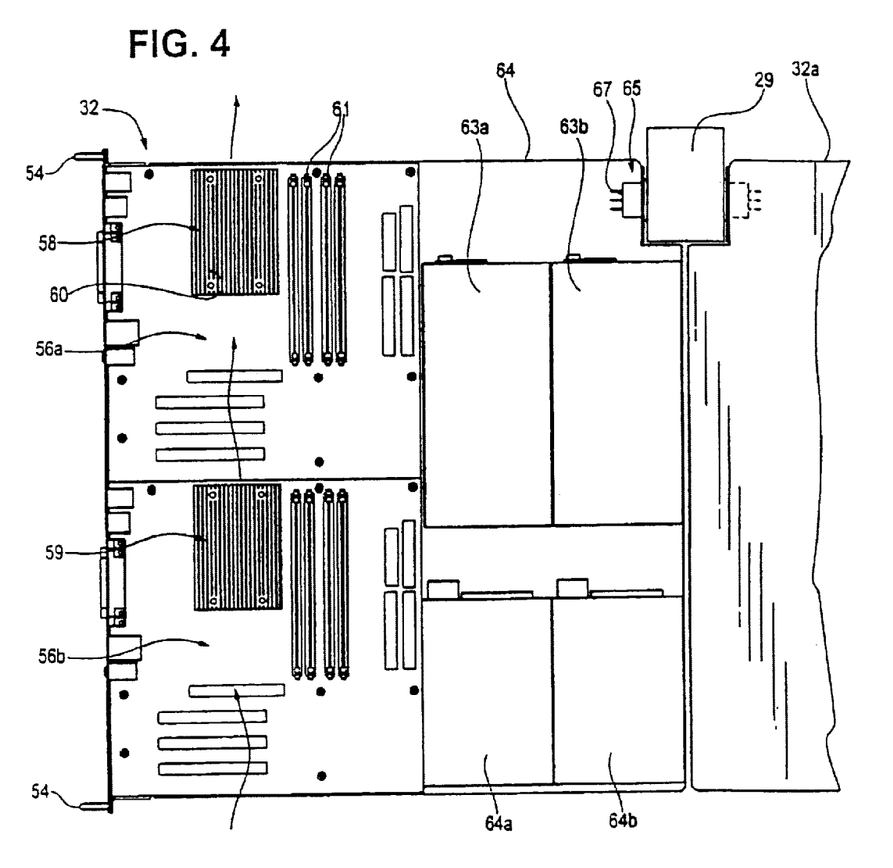
FIG. 4 is the left side elevational view of the blade of FIG. 3.

Referring now to FIGS. 2–4, the blades 32 and their installation into the rack housing 12 will now be described in greater detail. Each blade is provided with a pair of handles 54 which allow a user to easily manipulate the blade 32 to be grasped by the user to slide the blade into or out of its bay. Each blade 32 may include one or more mother boards 56. In the system illustrated in FIGS. 3 and 4, each blade 32 includes two mother boards 56a, 56b. Those skilled in the art will appreciate that the number of mother boards included in each blade 32 may be varied according to design. The mother board may include heat sinks such as heat sinks 58 and 59 for facilitating the cooling of the mother boards. Examples of the heat sinks are disclosed in greater detail in U.S. provisional attorney docket no. 035374-2003, filed May 31, 2002. Further, each mother board is provided with random access memory (RAM) 61. The amount of RAM 61 provided for each mother board may be varied as needed. A pair of power supplies 63a, 63b may be provided on the blade 32 for supplying power to their corresponding mother boards 56a, 56b. Similarly, a pair of hard disks 64a, 64b may also be provided on the blade 32.

All of the components are mounted on one side of a rigid plate or support 64, which is adapted to be supported vertically within its bay. Each blade 32 includes a cut-out corner portion or section 65 in its upper back portion. The cut-out portion 65 is sized to receive and accommodate the PDU 29 therebetween such that two opposing blades 32 and 32a accommodate the PDU 29 almost completely. Thus, a substantially zero footprint is achieved for the PDU 29. Each blade 32 is provided with an AC power inlet such as an inlet 67 at or near the cut-out portion 65. Thus, when the blade 32 is installed into the rack housing 12, the AC power inlet 67 engages electrically a corresponding AC connector such as a connector 76 of the PDU 29.

As most clearly illustrated in FIG. 2, the installation of the blade 32 may be achieved in a fast and efficient manner. The blade 32 is simply slid into either the front bay portion 16 or the rear bay portion 18 of a bay 14 of the rack housing 12. Each blade 32 is slid back until its AC power inlet 67 engages a corresponding AC connector 76 on the PDU 29. The intermediate dividers 19 serve as a back stop for the blades 32. Each blade 32 is secured in its slot by four blade screws 69, which attach the blade 32 to the rack housing 12.

Once the blade 32 has been mounted onto the rack housing 12, a short blade/LAN connector cable such as a cable 71 provides electrical networking connection between the blade 32 and a network such as a local area network, wide area network or a public network such as the internet. In this regard, the mother boards are each mounted at the front of each blade, and thus access thereto is readily available at front outlets.

An apparatus for performing diagnostic or maintenance functions on a computer component or system such as that described above with reference to FIGS. 1–4 will now be described with reference to FIGS. 5–8. The disclosed embodiments of the diagnostic apparatus allow use of a single such apparatus with numerous different computer systems or networks, for example. Further, the disclosed embodiments of the diagnostic apparatus allow a user to easily secure the apparatus to a desired location, perform the diagnostic functions, and easily remove the apparatus from the location so that it may be transported manually to another location where it may be mounted in a similar manner.

Figure 5:
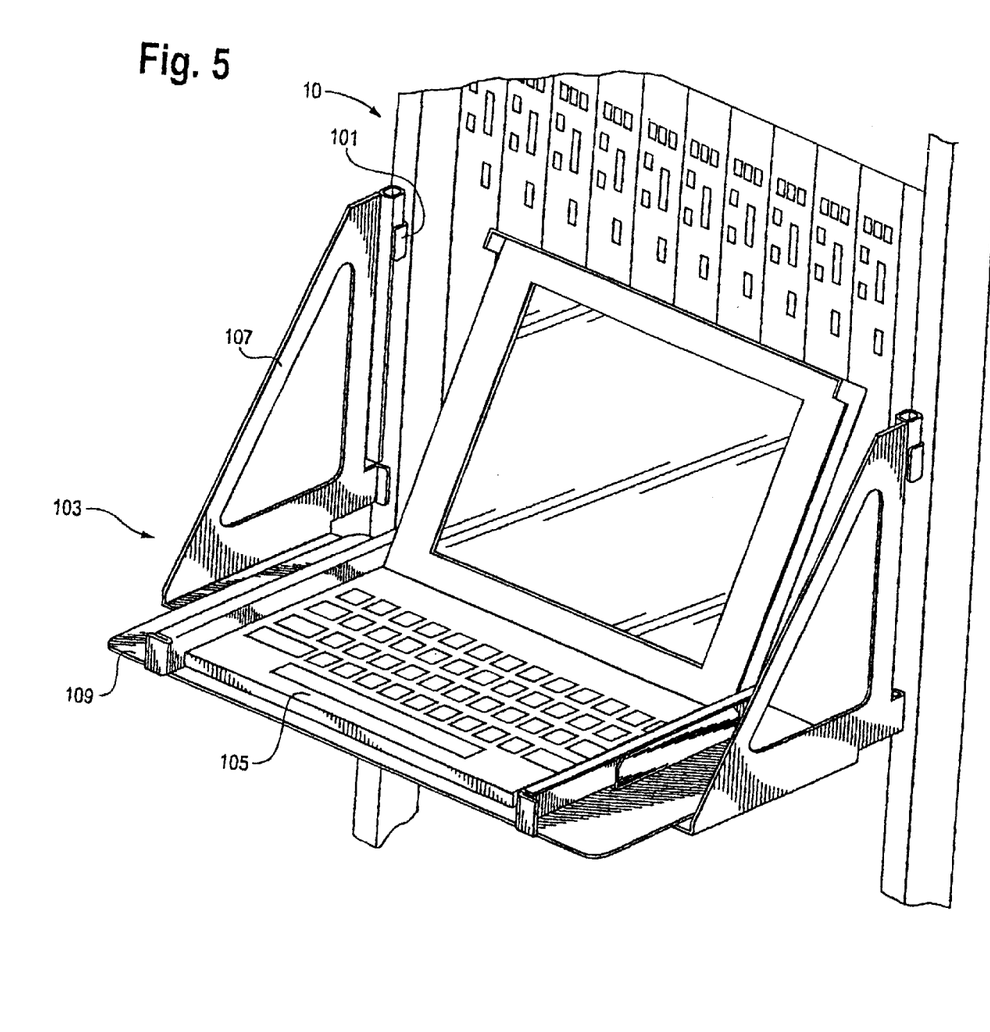
FIG. 5 is a pictorial view of one embodiment of a portable diagnostic assembly, which is constructed in accordance with one embodiment of the present invention, and which is mounted on the rack-mounted system of FIGS. 1 and 2, the keyboard of the assembly being omitted for sake of clarity.

FIG. 5 illustrates one embodiment of a diagnostic apparatus mounted onto the rack assembly described above with reference to FIGS. 1–4. In this embodiment, the housing of the rack system 10 is provided with support brackets in the form of pairs of pin-receiving tubes or sockets, such as pin-receiving tube 101, at various locations on the rack system 10. For example, one pair of pin-receiving tubes may be provided at each bay level on each side. The pin-receiving tubes illustrated in FIG. 5 are short, apertured, rectangular segments or blocks. It will be understood by those skilled in the art that other shapes and sizes may be used as well, as long as the tubes accommodate mounting pins on the diagnostic assembly, as described below. The pin-receiving tubes may be made of any suitable material such as aluminum, steel or plastic.

In other embodiments, pin-receiving tubes may be placed at various locations, for example, on walls. In this manner, the portable diagnostic assembly may be mounted at or near any desired location where access may be required.

Figure 6:
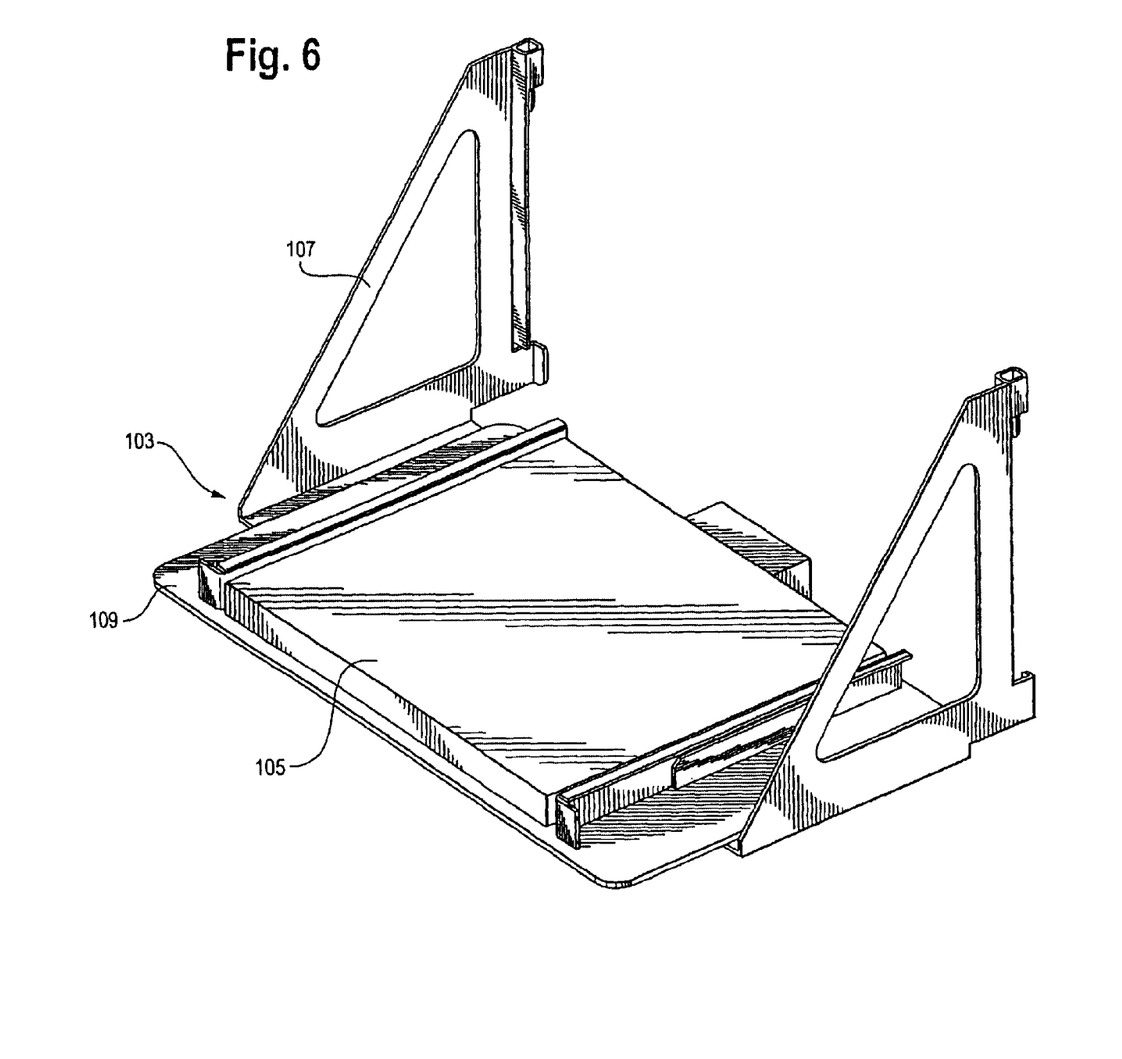
FIGS. 6 and 7 are views of a fully assembled portable diagnostic assembly of FIG. 5 with a diagnostic module in the closed and open positions, respectively.
Figure 7:
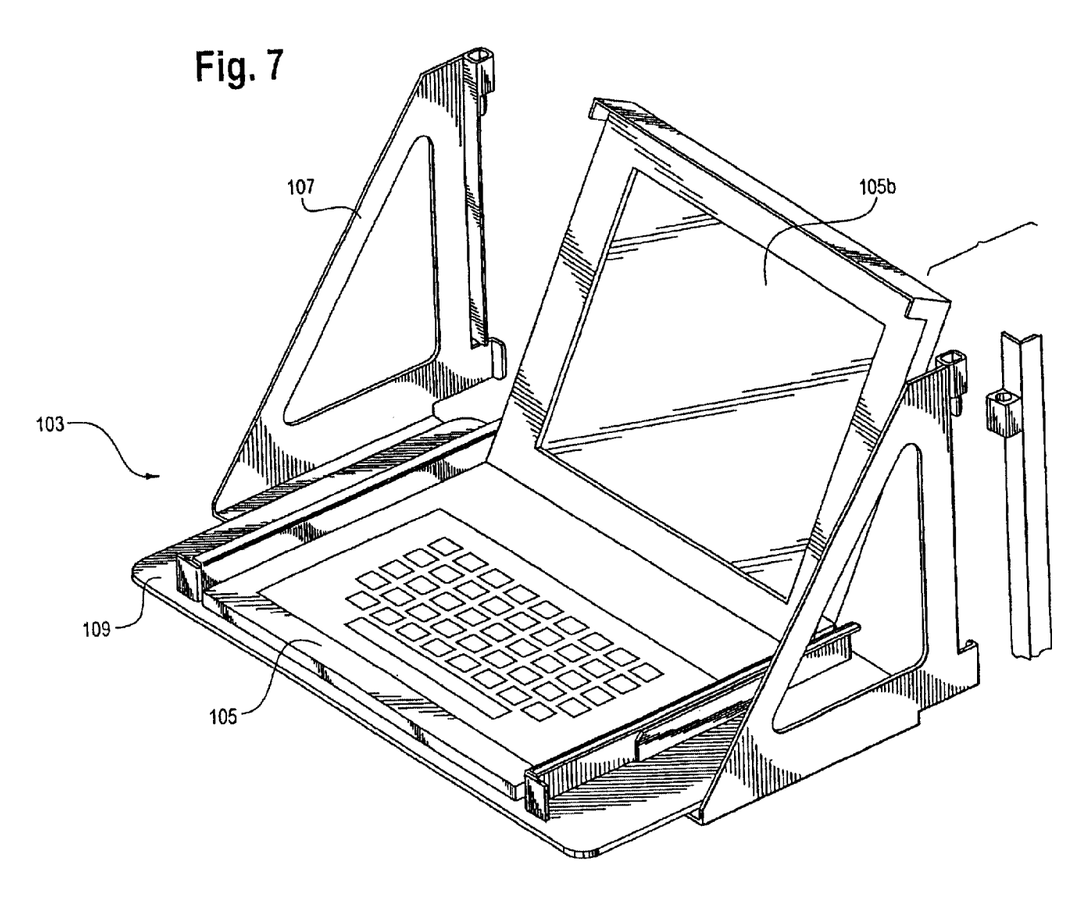

FIG. 5 illustrates one embodiment of a portable diagnostic assembly 103 secured to the rack 10 at the pin-receiving tubes. The portable diagnostic assembly 103 is shown detached from the rack 10 in FIGS. 6a and 6b. The portable diagnostic assembly 103 includes a diagnostic module 105. The diagnostic module 105 may be a computer terminal adapted to access a desired computer system or network, for example. The module 105 may or may not include a computer processor. In this regard, the diagnostic module 105 may be provided with appropriate software and hardware, as described. In the disclosed embodiment, the diagnostic module 105 is similar to a laptop computer having a keyboard 105a (FIG. 6b) and a display screen 105b (FIG. 6b). The display screen 105b may be folded down to close the diagnostic module, as illustrated in FIG. 6a in a manner similar to a conventional laptop computer.

The disclosed embodiment of the diagnostic assembly 103 is relatively light in weight and compact to enable it to be readily portable. The assembly 103 includes a pair of side panels or side support brackets, such as triangular side panel 107, and a generally rectangular support plate 109 for removably mounting the diagnostic module 105 at a desired location such as a rack system, as shown in FIG. 5, or to a wall, for example.

One embodiment of the side panel 107 is illustrated more clearly in FIG. 7. The side panel 107 is provided with an open triangular frame 112, a hypotenuse angular flange 112a of the triangle extending from the top rear to the bottom front. The hypotenuse flange 112a provides support for weight carried by a horizontal portion of the triangular frame 112.

The triangular frame 112 is composed of suitable material such as metal or plastic, and is provided with an open region 114 in the central portion of the triangle. This open region 114 reduces the overall weight of the portable diagnostic assembly 103, thereby improving maneuverability. A horizontal rail or flange 116 extends inwardly from the bottom edge of the triangular frame 112. The horizontal rail 116 provides a support surface for the support plate 109, described below in further detail. The horizontal rail 116 is provided with one or more holes, such as hole 118, for receiving fastening devices to secure the panel 107 to the support plate 109.

As shown in FIG. 7, a vertical stiffening flange 121 extends inwardly from the back edge of the triangular frame 112. The flange 121 provides a stiffening support, thereby tending to prevent buckling of the back edge of the triangular frame 112 when the frame 112 is under stress of a weight.

The side panel 107 is provided with a mounting pin 123 attached to a pin support block 125 at the back of the top portion of the flange 121. The pin 123 and the support block 125 are rigidly attached to the stiffening flange 121. In the illustrated embodiment, the mounting pin 123 is a depending bullet-shaped segment cantilevered to the pin support block 125. Thus, a predetermined clearance is maintained between the mounting pin 123 and the stiffening flange 121. The length of the pin support block 125 may be determined according to the total weight to be supported by the side panel 107.

A bottom abutment or tab 127 extends inward from a rearward protrusion 128 near the bottom of the back edge of the triangular frame 112. The length of the rearward protrusion 128 is selected so that the bottom abutment 127 is substantially aligned with the back surface of the pin support block 125.

In one embodiment, the entire side panel 107 may be integrally constructed. Alternatively, certain components, such as the mounting pin 123 and the pin support block 125 may be attached using any of a variety of known methods including welding, applying suitable adhesives, and others.

Although FIG. 7 shows a single side panel 107, it will be understood that a single portable diagnostic assembly 103 will generally require two side panels for many applications, each being a mirror image of the other.

Figure 8:
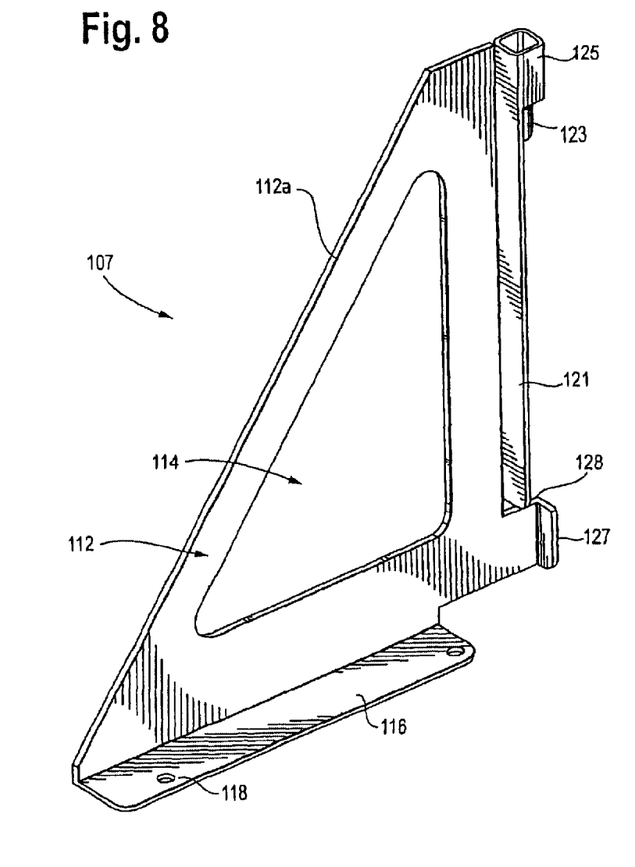
FIG. 8 is an enlarged pictorial view of one embodiment of a side panel or bracket of the portable diagnostic assembly of FIG. 5.

FIGS. 8a–c illustrate various views of one embodiment of the support plate 109. The illustrated support plate 109 includes a horizontal support surface 129 for securing the diagnostic module 105 thereon. The support surface 129 is a generally flat surface and may be provided with one or more openings, such as an opening 132. The openings may allow for ventilation for the diagnostic module 105 and may also function to reduce the overall weight of the portable diagnostic assembly 103.

The underside of the support plate 109 is provided with a plurality of depending pegs or other devices 134 adapted to engage the holes 118 in the side panel 107 described above. In this regard, the pegs 134 may be sized to securely fit into the holes 118 to provide a rigid and secure engagement of the support plate 109 to the side panels 107.

A pair of upstanding guide strips, such as guide strip 136, are provided on the support surface 129 of the support plate 109. The guide strips extend vertically from the support surface 129 and are oriented in a front-to-back position. Each of the guide strips is a mirror image of the other and are spaced apart from each other by a distance sufficient to accommodate the diagnostic module 105. In this manner, the guide strips function to facilitate mounting of the diagnostic module 105 to the support plate 109 and to secure the diagnostic module 105 thereon.

Fastener holes 138 are provided on each guide strip and are positioned to align with corresponding holes in the diagnostic module 105. Fasteners such as screws may be used to affix the diagnostic module 105 to the guide strips 136 and, therefore, to the support plate 109.

Thus, the portable diagnostic assembly 103 may be assembled as a single unit that can be carried by a user to a desired location. Once at the location, the user may slide the mounting pins 123 into corresponding pin-receiving tubes provided at the location. With the pins 123 in the tubes, the user may release the assembly 103. Under force of gravity, the bottom abutment 127 of each side panel 107 is forced against a wall or a housing, for example. Thus, the portable diagnostic assembly is securely mounted at the desired location. The user may then connect a cable leading from the diagnostic module 105 to an interface module, for example, of the computer, computer system or network. The user may then perform the necessary diagnostic or maintenance tasks. Once completed with the tasks, the user may simply disconnect the cable and lift the assembly 103 until the pins 123 have cleared the tubes. Thereafter, the user may simply use the same assembly 103 at another computer, computer system or network.

Figure 9:
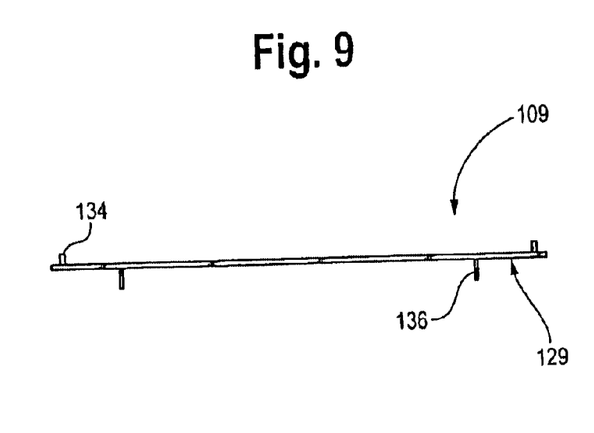
FIG. 9 is a top, pictorial view of one embodiment of a bottom support plate for the portable diagnostic assembly of FIG. 5.
Figure 10:
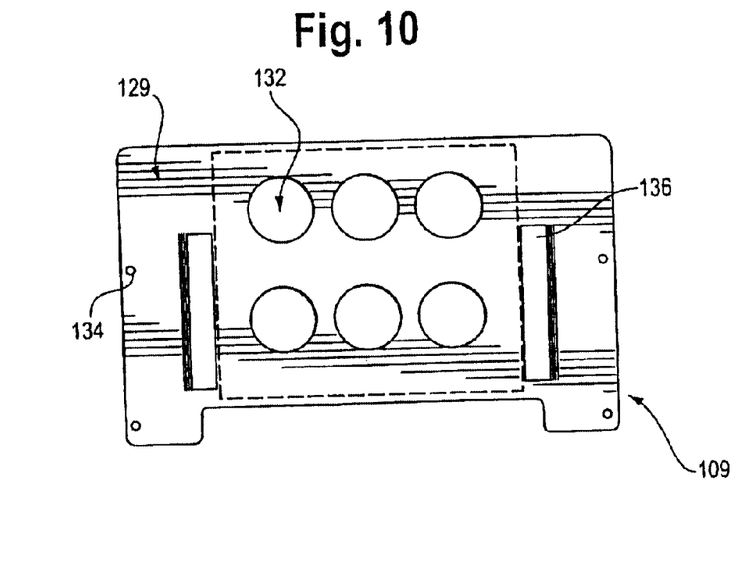
FIG. 10 is a side, pictorial view of the support plate of FIG. 9.
Figure 11:
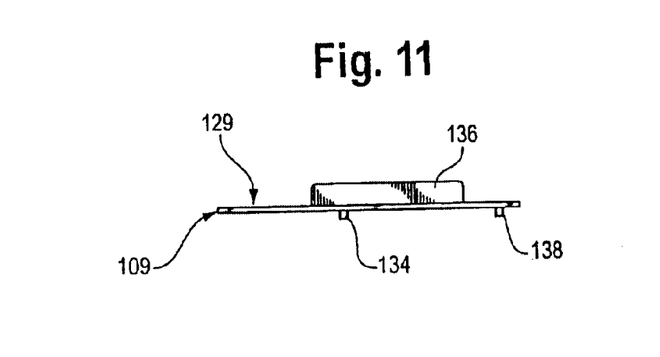
FIG. 11 is a front, pictorial view of the support plate of FIG. 7.
Figure 12:
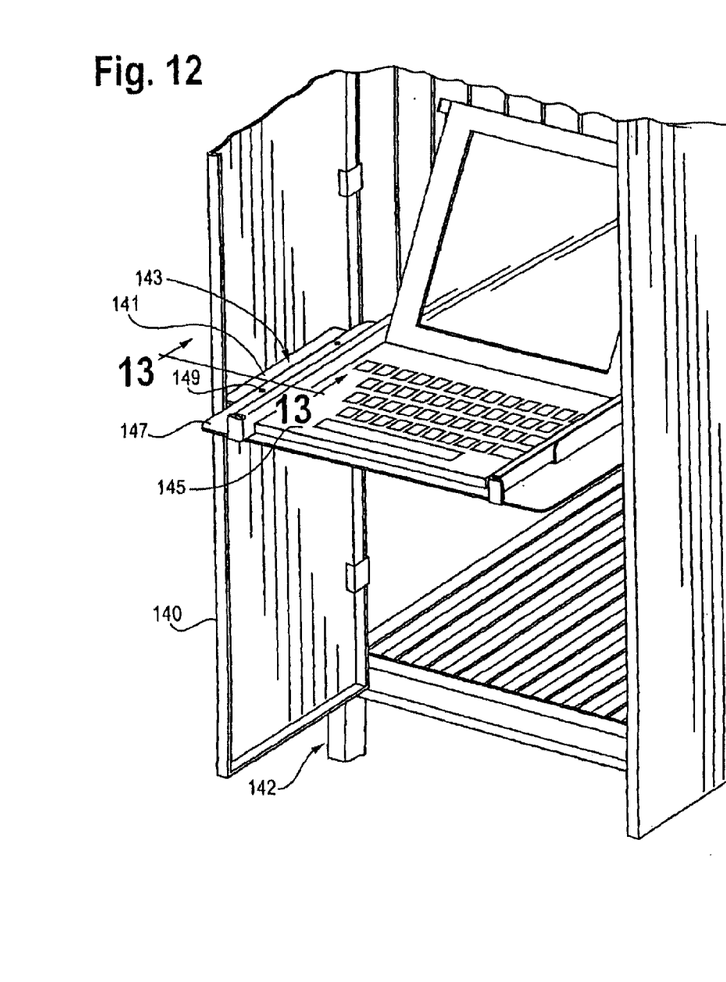
FIG. 12 is a fragmentary pictorial view of another embodiment of another portable diagnostic assembly, which is constructed according to another example of the present invention, and which is mounted between the opened doors of a computer system housing.
Figure 13:
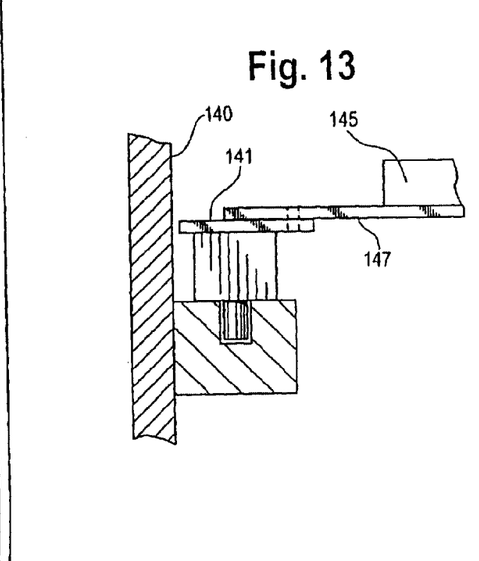
FIG. 13 is an enlarged detailed view of a portion of the embodiment of FIG. 12.

FIG. 9 illustrates another embodiment of a portable diagnostic assembly. In this illustrated embodiment, opposing rails, such as rail 141, are mounted at the desired location. In the embodiment illustrated in FIG. 9, the rails 141 are mounted on the inside of panel doors 140 for a rack mounted computer system 142. When the doors 140 are opened, the rails 141 are properly positioned to accommodate the portable diagnostic assembly 143.

In the embodiment illustrated in FIG. 9, the portable diagnostic assembly 143 includes a diagnostic module 145 (similar to the diagnostic module 105 described above with reference to FIGS. 5, 6a and 6b) and a support plate 147. The support plate 147 is substantially similar to the support plate 109 described above with reference to FIGS. 8a–c. Accordingly, in the embodiment illustrated in FIG. 9, the support plate 147 is provided with a plurality of pegs, such as peg 149 and guide strips 152 having fastener holes 154. The embodiment of the portable diagnostic assembly 143 illustrated in FIG. 9 lacks the side panels of the above-described embodiment. Rather, the pegs 149 of the support plate 147 are adapted to engage corresponding peg-receiving holes formed in the rails 141. Thus, a user may simply place the assembly 143 on the rails for a secure mounting and can lift and remove the assembly 143 in a convenient manner when finished.

While particular embodiments of the present invention have been disclosed, it is to be understood that various different modifications and combinations are possible and are contemplated within the true spirit and scope of the invention. There is no intention, therefore, of limitations to the exact disclosure herein presented.

What is claimed is:

1. An assembly for monitoring of computer components mounted on a rack, comprising:
    at least one support side panel for mounting the assembly to the rack;
    said side panel having means for attaching the panel to the pack and disposing the panel in front of the rack;
    a computer terminal having a display and an input device;
    said at least one panel includes means for attaching rigidly to the computer terminal to enable the terminal to be mounted in operative communication with the rack mounted computer components, in the front of the rack when said side panel is mounted to the rack.

2. An assembly according to claim 1, further including another support side panel.

3. An assembly according to claim 1, wherein said means for attaching the panel to the rack includes a pin and a socket, the pin forming a part of one of said means for attaching or the rack and the socket forming a part of the other one of said means for attaching or the rack.

4. The assembly according to claim 1, wherein said means for attaching rigidly to said bottom support means for supporting the terminal includes a bottom plate.

5. An assembly according to claim 1, wherein said panel is generally triangular in shape.

6. An assembly for facilitating the monitoring of computer components mounted on a rack using a computer terminal, comprising:
    at least one support side panel for mounting the terminal to the rack;
    said side panel having means for attaching the panel to the rack and disposing the panel in front of the rack;
    said at least one panel includes means for attaching rigidly to the computer terminal to enable the terminal to be mounted in operative communication with the rack mounted computer components, in the front of the rack when said side panel is mounted to the rack.

7. An assembly according to claim 6, further including another support side panel.

8. An assembly according to claim 6, wherein said means for attaching the panel to the rack includes a pin and a socket, the pin forming a part of one of said means for attaching or the rack and the socket forming a part of the other one of said means for attaching or the rack.

9. An assembly according to claim 6, wherein said means for attaching rigidly to said bottom support means for supporting the terminal includes a bottom plate.

10. An assembly according to claim 6, wherein said panel is generally triangular in shape.

* * * * *